United States Patent [19]
Ikemoto

[11] Patent Number: 5,826,292
[45] Date of Patent: Oct. 27, 1998

[54] DISK CLEANING AND DRYING APPARATUS

[75] Inventor: Kiyoshi Ikemoto, Ayase, Japan

[73] Assignee: Speedfam Co., Ltd., Japan

[21] Appl. No.: 882,560

[22] Filed: Jun. 25, 1997

[30] Foreign Application Priority Data

Jun. 27, 1996 [JP] Japan ................................. 8-185344

[51] Int. Cl.$^6$ .................................................. B08B 11/02
[52] U.S. Cl. ................................ 15/102; 15/77; 15/88.3; 15/97.1
[58] Field of Search ............................. 15/77, 88.2, 88.3, 15/88.4, 97.1, 102

[56] References Cited

U.S. PATENT DOCUMENTS

| 5,092,011 | 3/1992 | Gommori et al. . |
| 5,357,645 | 10/1994 | Onodera ................................ 15/88.2 |

FOREIGN PATENT DOCUMENTS

| 62-82513 | 4/1987 | Japan . |
| 62-84970 | 4/1987 | Japan . |
| 3-44880 | 2/1991 | Japan . |
| 3-93040 | 4/1991 | Japan . |

*Primary Examiner*—Randall E. Chin
*Attorney, Agent, or Firm*—Fitch, Even, Tabin & Flannery

[57] ABSTRACT

A disk cleaning and drying apparatus is capable of cleaning and drying a great number of disks per unit time to a substantially complete or satisfactory extent without increasing the overall size thereof. A cleaning unit has a first index table with a plurality of first holders for holding disks to be cleaned, a plurality of cleaning elements provided on the first index table for cleaning the disks, and a first drive device for driving the first index table to rotate at a first predetermined angle of rotation to thereby move disks held by the plurality of holders to the cleaning elements. A drying unit has a second index table with a plurality of second holders for holding disks to be dried, a plurality of drying members provided on the second index table for drying the disks, and a second drive device for driving the second index table to rotate at a second predetermined angle of rotation. A conveyor unit is adapted to reciprocate for conveying disks to be cleaned from a first point to a second point at which the disks thus conveyed are delivered to and held by one of the first holders just positioned at the second point. The conveyor takes disks which have been cleaned by the cleaning unit out of one of the first holders positioned at the second point and convey them to the third point at which the disks thus conveyed are delivered to and held by one of the second holders just positioned at the third point, the conveying means being further operable to take disks which have been dried by the drying unit out of one of the second holders of the second index table positioned at the third point and convey them to the fourth point.

8 Claims, 10 Drawing Sheets

DISK CLEANING AND DRYING APPARATUS

BACKGROUND OF THE INVENTION

1. Field of the Invention

This invention relates to a disk cleaning and drying apparatus for cleaning and drying disks such as information storage disks including magnetic hard disks, optical disks, magneto-optical disks, etc., and more particularly, it pertains to such an apparatus which is capable of cleaning and drying a multitude of disks in a continuous manner.

2. Description of the Prior Art

Conventionally, a typical example of this type of cleaning and drying apparatus is disclosed in Japanese Patent Laid-Open No. 3-93040.

FIG. 15 schematically shows the construction of the conventional disk cleaning and drying apparatus. As shown in this figure, the apparatus comprises a conveyor unit 100, a cleaning unit 200, and a drying unit 300.

According to this apparatus, a disk D after having been polished is taken out of a disk magazine 110 by means of an arm 101 and conveyed to a reception position M1 on an index table 201 of the cleaning unit 200. When the disk D thus transferred is received by the index table 201 at the reception position M1, the index table 201 is driven to rotate over an angle of 90 degrees in a direction of arrow A to a cleaning position M2, where the disk D is subjected to a cleaning operation by means of a cleaning device 202. Thereafter, the index table 201 is rotated over an angle of 90 degrees to thereby transfer the disk D to a cleaning position M3 where the disk D is again cleaned by means of another cleaning device 203.

After the repeated cleaning operations are finished, the disk D is transferred to a take-out position M4 by virtue of a rotary motion of the index table 201, where it is transported to an index table 301 of the drying unit 300 by means of the arm 102.

When the disk D is received by the index table 301 at a reception position N1 thereon, the index table 301 is driven to rotate through an angle of 90 degrees in a direction of arrow B to thereby transfer the disk D to a drying position N2, where the disk D is driven to rotate at a high speed, so that it is dried by a spin drying operation.

The disk D, after having been dried at the drying position N2, is transferred to a next drying position N3 where it is again subjected to another spin drying operation.

Subsequently, the disk D having been repeatedly spin dried, is transferred to a take-out position N4, where it is conveyed to a disk magazine 120 by means of an arm 130.

The operation of the conveyor unit 100 is synchronized with the rotational operations of the index tables 201, 301 of the cleaning unit 200 and the drying unit 300.

That is, when a disk D having been polished is transferred to the reception position M1 of the index table 201 under the action of the arm 101, another disk D having been cleaned at the reception position M4 is conveyed from the take-out position M4 of the index table 201 to the reception position N1 of the index table 301 by means of the arm 102, and at the same time, a further disk D having been spin dried is conveyed from the take-out position N4 of the index table 301 to the disk magazine 120 by means of the arm 103.

In this manner, a multitude of disks D are continuously transferred by means of the arm 101 through 103 and the index tables 201, 301 as if they are conveyed by a belt conveyor, during which they are subjected to cleaning and drying operations.

With the above-mentioned conventional disk cleaning and drying apparatus, however, there arise the following problems.

First, the apparatus is constructed such that the transferring operations of the arms 101 through 103 and the cleaning and drying operations at the index tables 201, 301 are carried out for a single disk D at one time, so that the number of disks to be treated per unit time is relatively limited.

In contrast to this, firstly, it is contemplated that the number of disk treatments per unit time is enhanced by increasing the conveying speeds of the arms 101 through 103 and the rotational speeds of the index tables 201, 301. In this case, however, if these speeds are too high, it is difficult to ensure sufficient cleaning and drying times for each disk D.

Secondly, since the reception positions M1, N1 and the take-out positions M4, N4 at the index tables 201, 301 are different from each other, the number of disks to be cleaned and dried on the index tables 201, 301 at one time are accordingly reduced.

On the contrary, it is also contemplated that the diameters of the index tables 201, 301 are enlarged so that the number of disks D carried on each index table can be increased, but in this case, the entire apparatus becomes large in size.

Thirdly, when at the cleaning unit 202, a disk D is cleaned by means of a rotating cleaning device in the form of a pad which is placed in contact with a surface of a disk D while supplying a detergent thereto, the detergent may not be distributed, if the cleaning device is in close contact with the disk surface, into an entire space between the cleaning device and the disk surface to a sufficient extent, thus resulting in unsatisfactory cleaning.

Fourthly, since a disk D is driven to rotate for spin drying with its inner peripheral edge defined by a central aperture DR being chucked by a plurality of (four in this example) holders 302 inserted therein, as shown in FIG. 16, it is difficult to fly away or spatter a part of liquid attached to the inner peripheral edge of the disk D contacted by the holders 302. This is because a rotational speed at the inner periphery of the disk D near the central aperture RD is at a minimum so it is difficult to obtain a large centrifugal force enough to spatter the liquid lying between the inner peripheral edge of the disk D and the holders 302. For this reason, the disk D after having been dried sometimes has smears or scars of the remaining liquid.

Fifthly, although the index table 301 is provided with a plurality of protective walls 305 one for each disk for preventing splashing or spattering of cleaning liquid or water, droplets of such liquid or water having been spattered from rotating disks D and adhered to the protective walls 305 may fall down to be again attached to the disks D, thus contaminating or smearing the disk surfaces.

SUMMARY OF THE INVENTION

The present invention is intended to obviate the above-described various problems encountered with the conventional cleaning and drying apparatus, and has for its object to provide a novel and improved disk cleaning and drying apparatus which is capable of cleaning and drying a great number of disks per unit time to a substantially complete or satisfactory extent without increasing the overall size thereof.

Bearing the above object in mind, according to the present invention, there is provided a disk cleaning and drying apparatus comprising:

a cleaning unit having a first index table with a plurality of first holders for holding disks to be cleaned, cleaning means provided on the first index table for cleaning the disks, and first drive and control means for driving the first index table to rotate at a first predetermined angle of rotation to thereby move disks held by the plurality of holders to the cleaning means;

a drying unit having a second index table with a plurality of second holders for holding disks to be dried, drying means provided on the second index table for drying the disks, and second drive and control means for driving the second index table to rotate at a second predetermined angle of rotation; and conveyor means adapted to reciprocate from a first point to a second point, and from the second point to a third point, and from the third point to a fourth point, in a unitary manner for conveying disks to be cleaned from the first point to the second point at which the disks thus conveyed are delivered to and held by one of the first holders of the first index table just positioned at the second point, the conveying means being operable to take disks which have been cleaned by the cleaning unit out of one of the first holders positioned at the second point and convey them to the third point at which the disks thus conveyed are delivered to and held by one of the second holders of the second index table just positioned at the third point, the conveying means being further operable to take disks which have been dried by the drying unit out of one of the second holders of the second index table positioned at the third point and convey them to the fourth point.

With the above arrangement, delivery and take-out of disks are carried out by means of one of the first or second holders of the first or second index table located at the second or third point, the one holder being only one that has no contribution to the cleaning or drying operation. As a result, all the disks being held by the remaining holders can be subjected to the cleaning or dying operation, so that a great number of disks can be cleaned or dried within a short period of time without increasing the diameter of the first or second index table.

In a preferred form of the invention, the conveyor means can convey a plurality of disks at one time, and each of the first and second holders of the first and second index tables can hold the plurality of disks conveyed by the conveyor means at one time.

According to this arrangement, a plurality of disks can be conveyed at one time by the conveyor means, and then they can be cleaned and dried while being held by holders of the first and second index tables, so that the number of disks to be treated per unit time can be greatly increased while keeping a sufficient cleaning time and a sufficient drying time.

In another preferred form of the invention, the cleaning means comprises:

a first cleaning element being rotatable while contacting surfaces of a plurality of disks to be cleaned;

a second cleaning element being rotatable while contacting an inner peripheral edge of each of the plurality of disks to be cleaned, the second cleaning element being movable toward and away from each disk in an axial direction thereof; and a third cleaning element being rotatable while contacting an outer peripheral edge of each of the plurality of disks to be cleaned, the third cleaning element being movable toward and away from each disk in an axial direction thereof.

According to this arrangement, there will be no localized wear on the second and third cleaning elements during the time when the inner and outer peripheral edges of each disk are cleaned by the first through third cleaning elements, so that these cleaning elements can have an improved cleaning performance or efficiency as well as an increased span of life.

In a further preferred form of the invention, the first cleaning element comprises: a plate member having a bore formed in its central portion for supply of a cleaning medium; and a absorbent cleaning member secured to the plate member for contacting and cleaning a surface of each disk to be cleaned, the absorbent cleaning member being supplied with the cleaning medium through the bore in the plate member.

According to the above arrangement, the cleaning medium such as a detergent is absorbed by the absorbent cleaning member of the first cleaning element and spreads over the entire body thereof so that it can uniformly be delivered between the absorbent cleaning member and the surface of each disk, thus realizing sufficient cleaning of the entire disk surface.

In a further preferred form of the invention, each of the second holders of the drying unit rotates a corresponding one of said disks while holding an outer peripheral edge thereof.

According to the above arrangement, since each of the second holders of the drying unit do not hold the inner peripheral edge of each disk but the outer peripheral edge thereof, the liquid attached to the inner peripheral edge of each disk can be caused to spatter, thus realizing substantially complete drying of each disk.

In a further preferred form of the invention, the drying unit further comprises fluid ejecting means for ejecting fluid to the rotating disks to be dried.

According to the above arrangement, each disk can be dried to a further improved extent under a synergetic effect of a liquid spattering function due to disk rotation and a fluid ejection function of the fluid ejecting means. As a consequence, it is possible to provide disks of improved quality which are high in completeness as products.

In a further preferred form of the invention, the drying unit further comprises protection wall means provided on the second index table so as to surround the second holders for absorbing liquid spattered from the rotating disks to be dried.

According to the above arrangement, the liquid being spattered from the rotating disks to be dried is absorbed by the protection wall means, thus preventing such a situation that the spattered liquid attached to the protection wall means falls down and is again attached to the disks being dried.

The above and other objects, features and advantages of the present invention will more readily apparent to those skilled in the art from the ensuing detailed description of the invention when taken in conjunction with the accompanying drawings.

BRIEF DESCRIPTION OF THE DRAWINGS

FIG. 13($b$) is a cross section showing a rotating state of the modified cleaning element;

FIG. 14($b$) shows that the disks are being conveyed by the handles; FIG. 14($c$) shows that the disks are delivered from one handlers to another; and FIG. 14($d$) shows that the handlers are being returned to their initial positions;

DETAILED DESCRIPTION OF THE PREFERRED EMBODIMENTS

Now, a preferred embodiment of the present invention will be described in detail while referring to the accompanying drawings.

Figure 1:
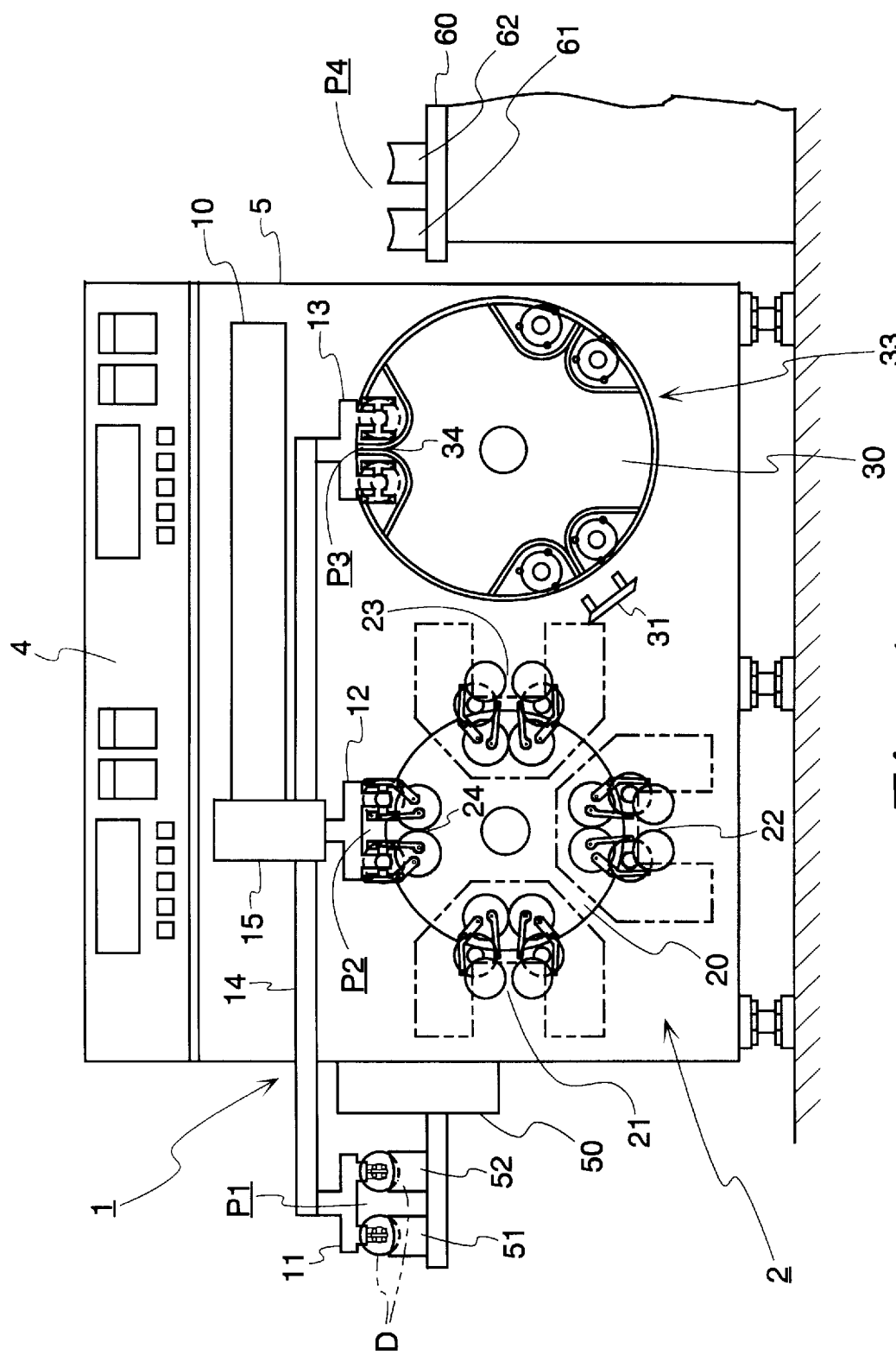
FIG. 1 is a front elevational view of a disk cleaning and drying apparatus according to the present invention.

FIG. 1 illustrates a disk cleaning and drying apparatus constructed in accordance with principles of the present invention.

As shown in FIG. 1, the apparatus comprises a conveyor unit 1, a cleaning unit 2 and a drying unit 3 all disposed in a housing with a control panel 4.

The conveyor unit 1 comprises a first conveyor element in the form of a first handler 11, a second conveyor element in the form of a second handier 12 and a third conveyor element in the form of a third handler 13 which are adapted to move in a unitary manner in a horizontal direction, i.e., in the right-and-left direction in FIG. 1.

Specifically, the first through third handlers 11, 12 and 13 are mounted on a rail 14 at one end thereof (i.e., a left-hand end in FIG. 1), at a center thereof, and at the other end thereof (i.e., a right-hand end in FIG. 1), respectively. The rail 14 is in turn mounted at a center thereof on a slider 15 which is caused to reciprocate by means of a drive element 10 such as a hydraulic or pneumatic cylinder.

With this arrangement, the first handier 11 is movable between a first point P1 and a second point P2, and the second handler 12 is movable between the second point P2 and a third point P3, and the third handler 13 is movable between the third point P3 and a fourth point P4.

At the first point P1, a lift unit 50 is mounted on a side surface of the housing 5 for vertically moving magazines 51, 52 each receiving a disk therein to the first point P1.

The first handier 11 serves to hold and convey a pair of disks D received in the magazines 51, 52, respectively, from the first point P1 to the second point P2.

Figure 2:
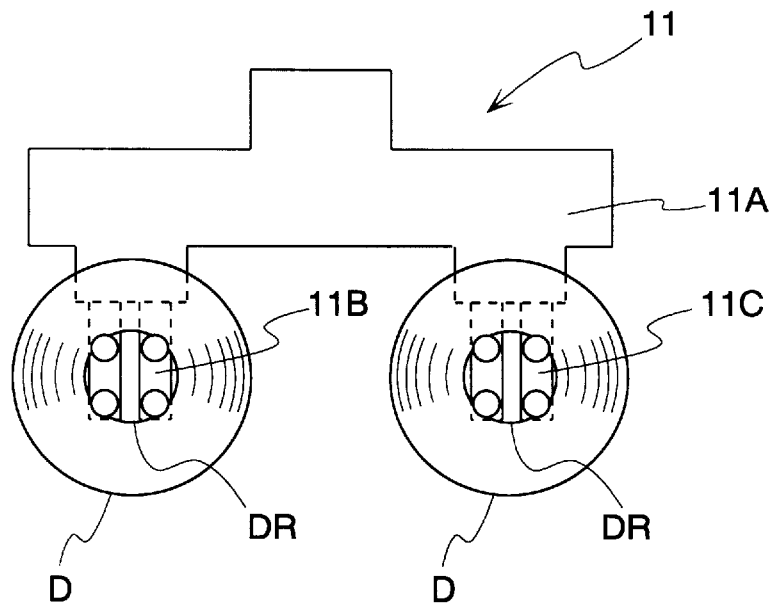
FIG. 2 is a rear view of a first conveyor in the form of a first handler.

FIG. 2 illustrates the first handier 11 viewed from the rear side thereof.

As seen from FIG. 2, the first handier 11 has a base 11 a attached to the rail 14 with a pair of chucks 11$b$, 11$c$ being disposed under the base 11$a$.

The pair of chucks 11$b$, 11$c$ are adapted to be inserted into a central aperture DR in a disk D and are moved in radially outward directions of the disk D so as to engage or abut against the inner peripheral edge of the disk D to firmly hold it from the inside thereof.

As shown in FIG. 1, the cleaning unit 2 and the drying unit 3 are disposed at the second and third points P2, P3, respectively. The second handler 12 conveys two disks d from the second point P2, at which the cleaning unit 2 is disposed, to the third point P3, and also the third handler 13 conveys further two disks D from the third point P3, at which the drying unit 3 is disposed, to the fourth point P4.

Figure 3:
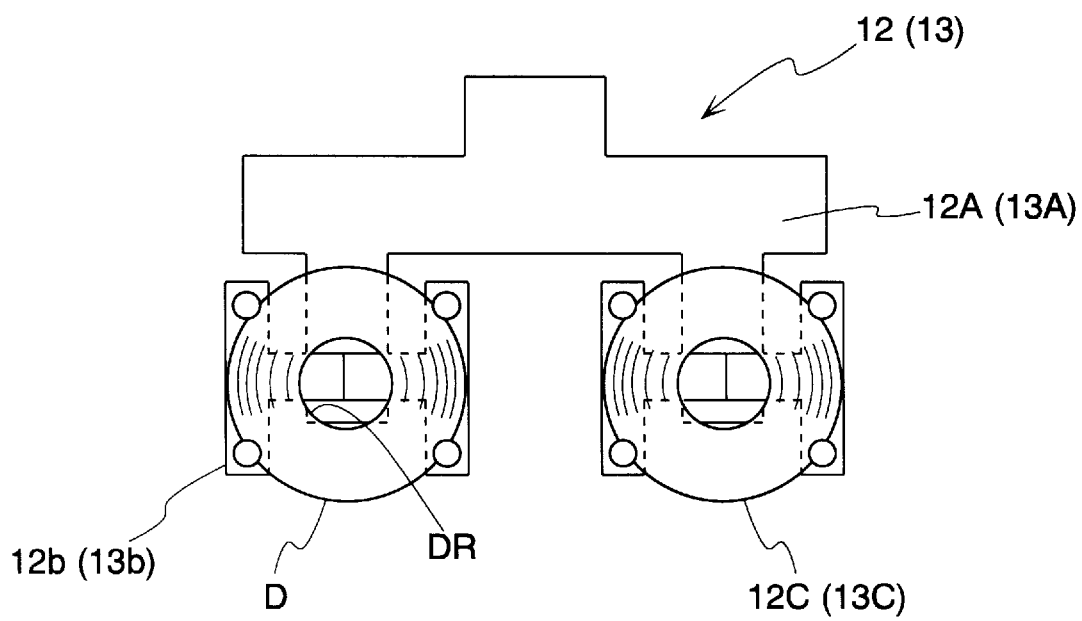
FIG. 3 is a rear view of a second (or third) conveyor in the form of a second (or third) handler.

FIG. 3 illustrates the second and third handlers 12, 13 seen from the rear thereof.

As shown in FIG. 3, the handlers 12, 13 each have a base 12$a$ or 13$a$ under which a pair of chucks 12$b$, 12$c$ or 13$b$, 13$c$ are disposed. The pair of chucks 12$b$, 12$c$ or 13$b$, 13$c$ are adapted to be moved in radially inner directions of a disk D so as to clamp the outer peripheral edge of the disk D, thereby firmly holding it from the outside thereof.

In this manner, the handlers 11 through 13 are each able to convey two disks D at the same time while firmly holding them by the pairs of chucks 11$b$, 11$c$; 12$b$, 12$c$; 13$b$, 13$c$.

In FIG. 1, the cleaning unit 2 serves to clean disks D conveyed there by means of the first handler 11, and it comprises a first index table 20 and three cleaning devices 21 through 23.

Figure 4:
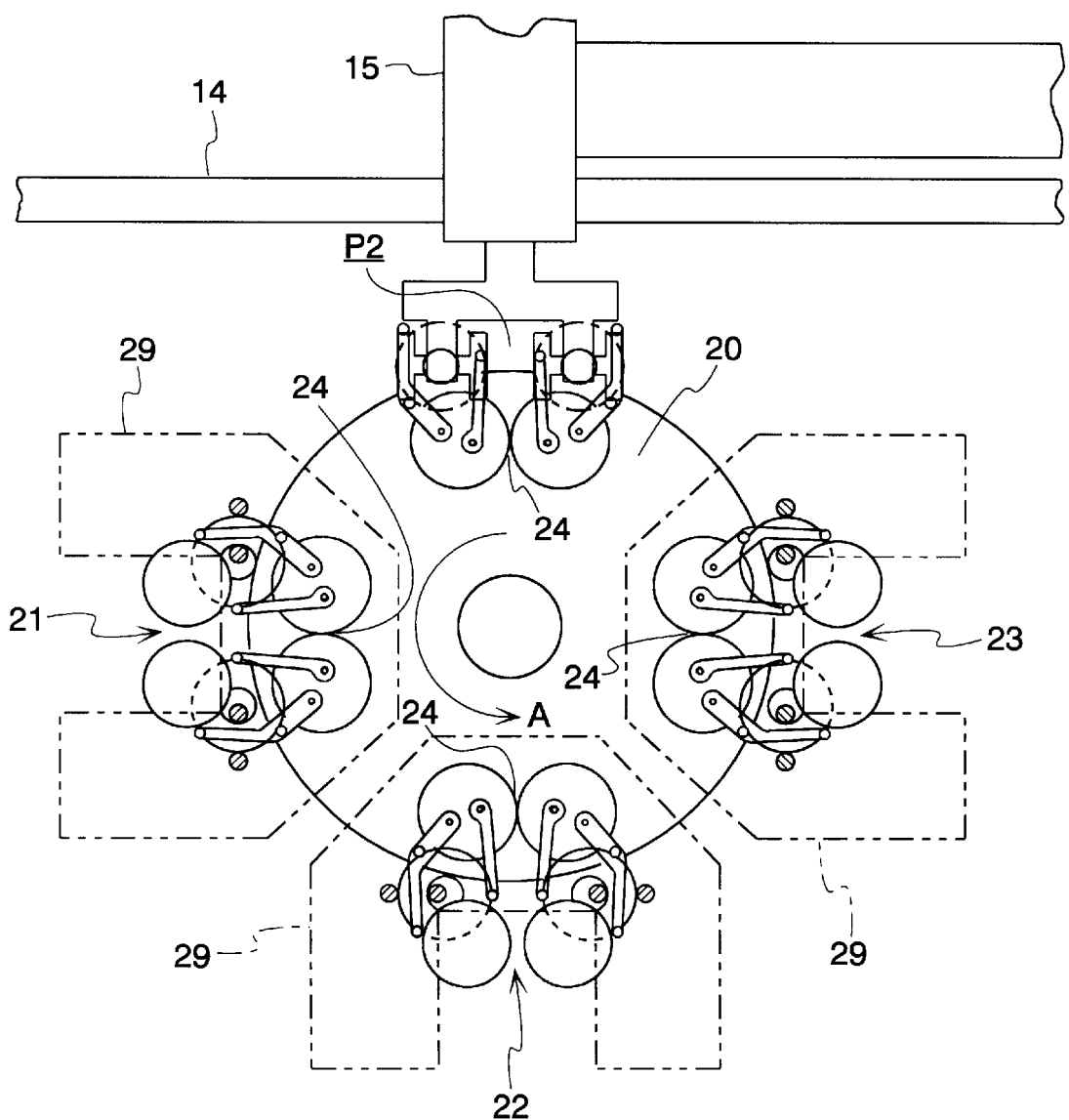
FIG. 4 is an enlarged front elevational view of a cleaning unit.
Figure 5:
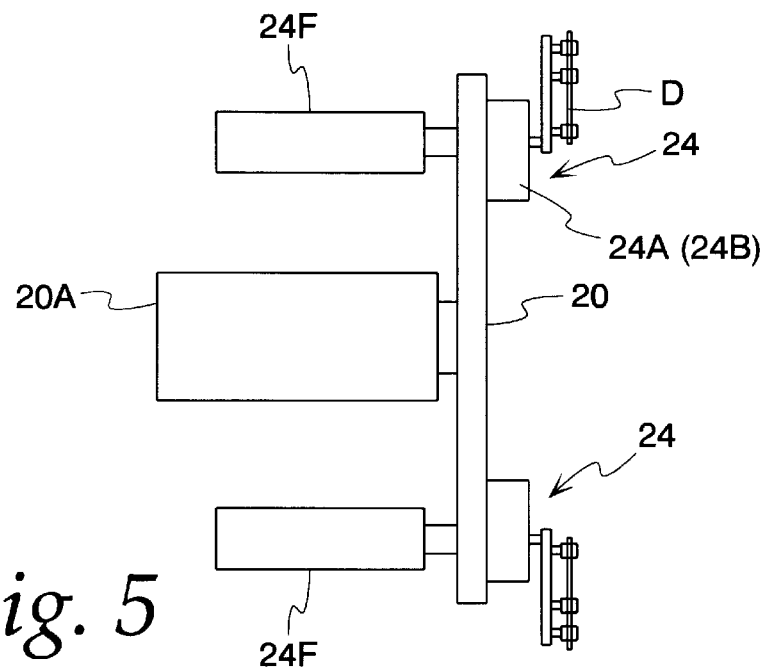
FIG. 5 is a side elevational view showing the construction of the cleaning unit.

FIG. 4 shows the cleaning unit 2 on an enlarged scale, and FIG. 5 shows the construction of the cleaning unit 2 from one side thereof.

As shown in FIG. 4, the first index table 20 comprises a circular rotary member which is driven to rotate at an angle of 90 degrees in a stepwise manner by means of a geared motor 20$a$, which is clearly shown in FIG. 5.

The index table 20 is provided at its periphery with a plurality of (e.g., four in the illustrated embodiment) holders 24 at equal circumferential intervals, i.e., 90 degrees apart from each other.

Figure 6:
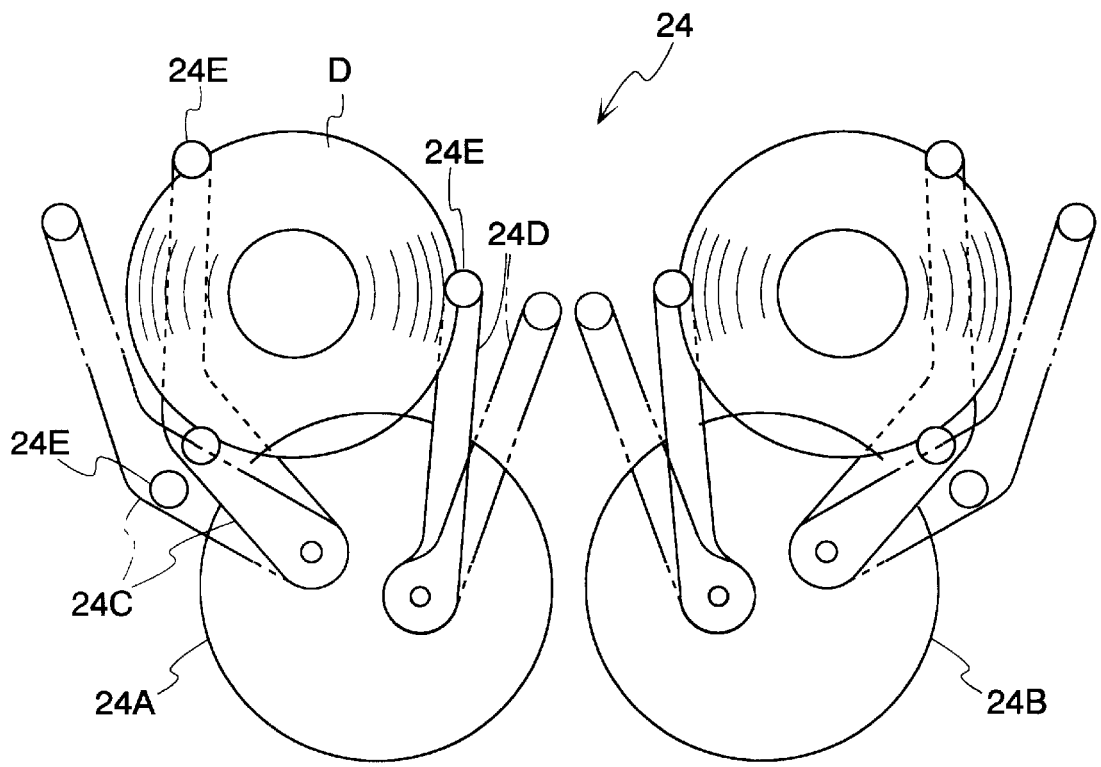
FIG. 6 is a front elevational view of holders of the cleaning unit.

FIG. 6 illustrates one of the holders 24 as viewed from the front side thereof.

As shown in FIG. 6, each of the holders 24 comprises a pair of chucks 24$a$, 24$b$. Each of the chucks 24$a$, 24$b$ has a pair of arms 24$c$, 24$d$ which are provided with rollers 24$e$.

These chucks 24$a$, 24$b$ are each controlled by a cylinder 24$f$ mounted on the rear side of the index table 20, as clearly seen from FIG. 5.

Specifically, each pair of arms 24$c$, 24$d$ are closed or moved toward each other to hold the peripheral edge of a disk D, as indicated by solid lines in FIG. 6, and opened or moved away from each other to release the disk D, as shown by two-dot and dash lines in FIG. 6.

The first index table 20 equipped with the cylinders 24$f$, as shown in FIG. 5, is driven to rotate at an angle of 90 degrees in a direction indicated by an arrow A in FIG. 4 in a stepwise manner under the control of the geared motor 20$a$, so that the four holders 24 are similarly rotated over 90 degrees to their next positions, with a top or uppermost one of the holders 24 being positioned at the second point P2.

The cleaning devices 21 through 23 are disposed at the respective positions of stepwise rotation of the index table 20, i.e., at 90 degrees apart from each other with side ones 21, 23 in FIG. 4 being 90 degrees apart from the second point P2 in the counterclockwise and clockwise directions, respectively.

Figure 7:
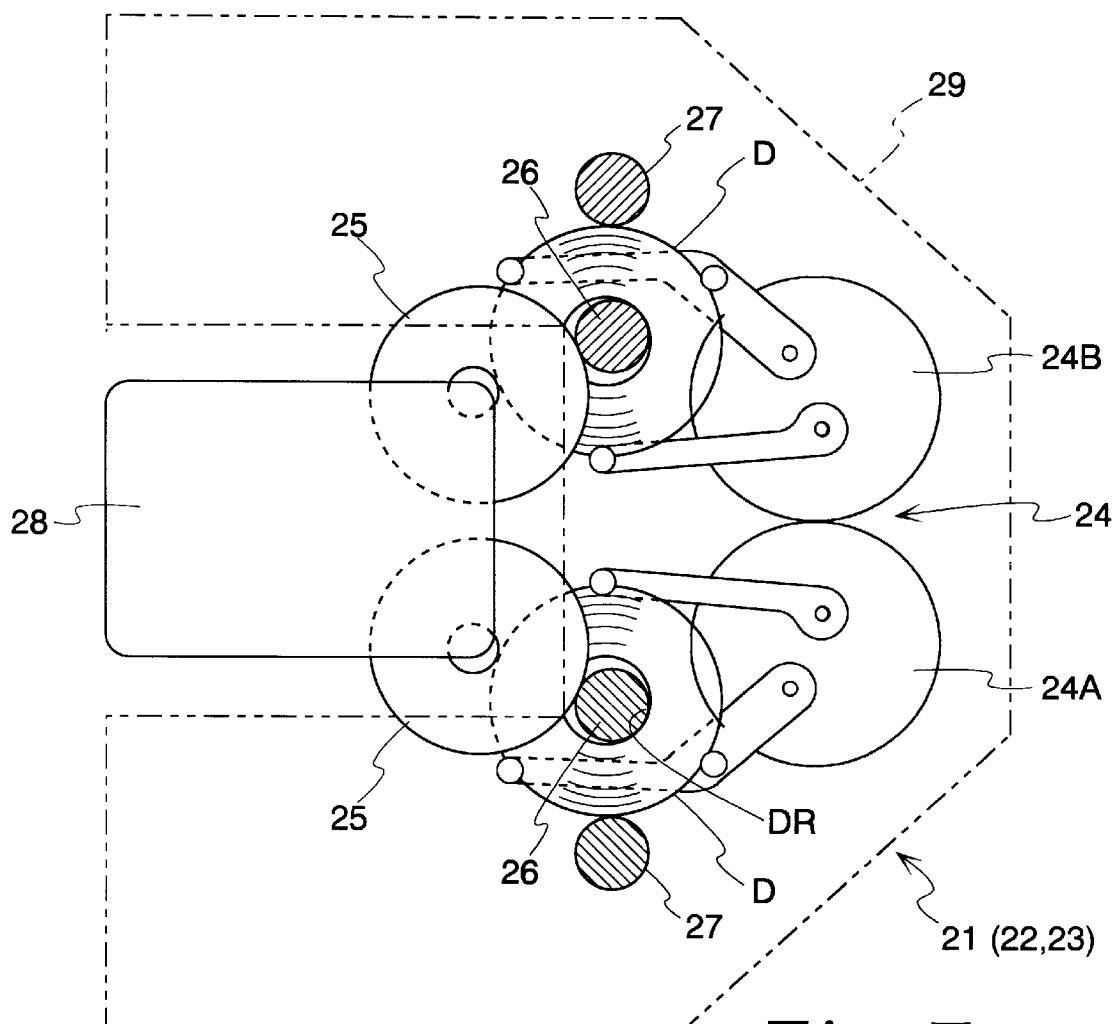
FIG. 7 is a schematic view showing the construction of a cleaning device.

The cleaning devices 21 through 23 are of the same construction, as schematically illustrated in FIG. 7.

Figure 9:
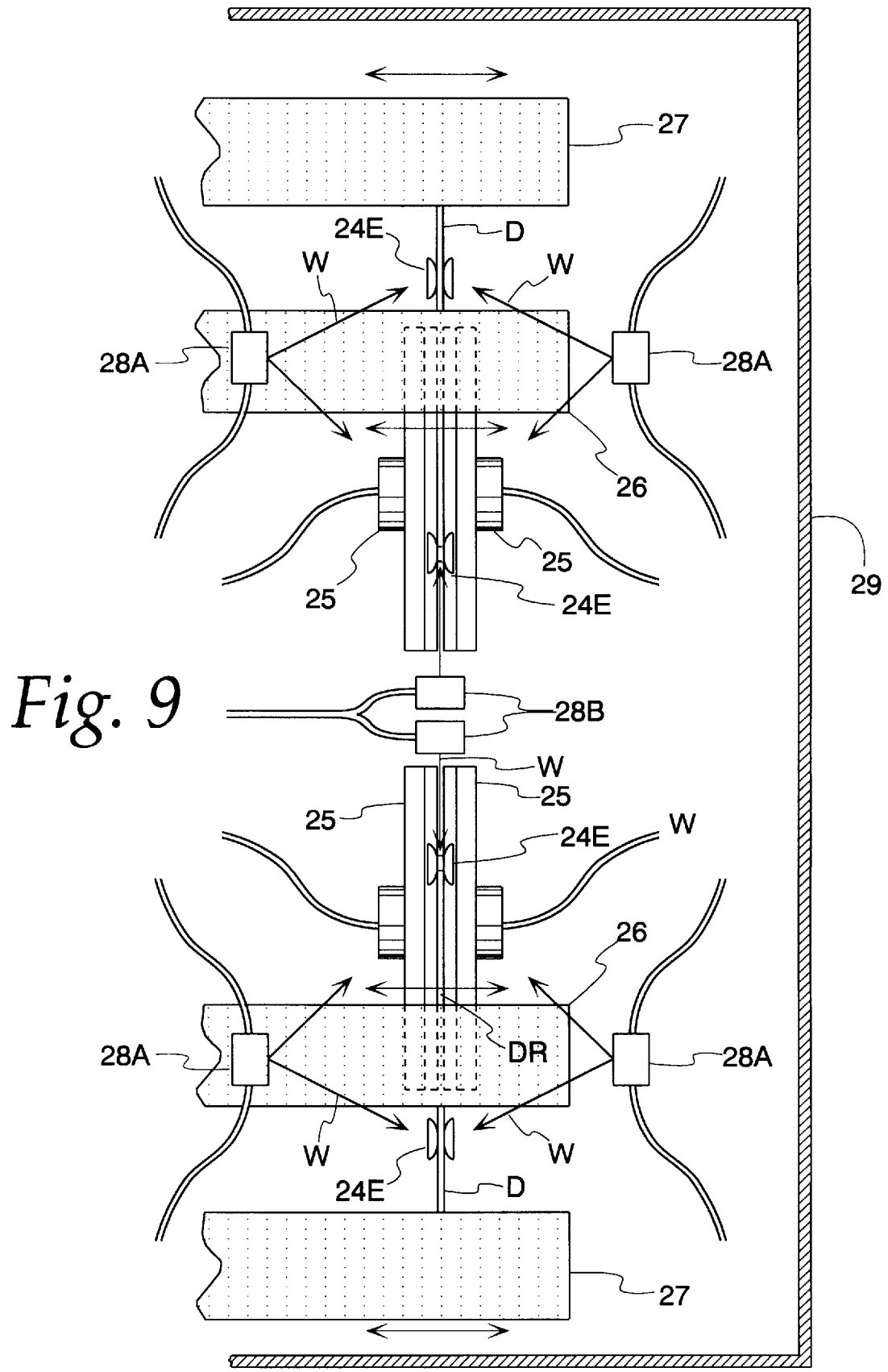
FIG. 9 is a schematic cross section showing the arrangement of nozzles.

As shown in FIGS. 7 and 9, each of the cleaning devices 21, 22, 23 comprises a first pair of cleaning elements in the form of sponge pads 25 for cleaning the opposite surfaces of a disk D, a second cleaning element in the form of an elongated sponge pad 26 for cleaning the inner peripheral edge of the disk D, and a third cleaning element in the form of an elongated sponge pad 27 for cleaning the outer peripheral edge of the disk D.

Figure 8:
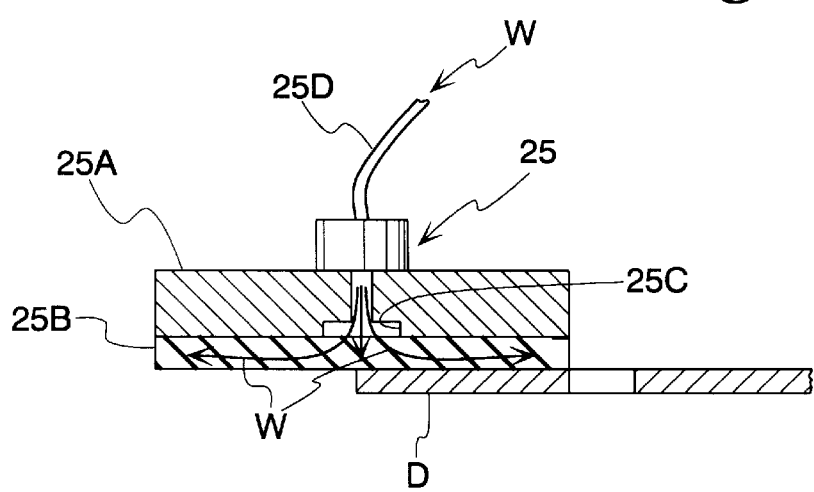
FIG. 8 is a cross section of a sponge pad.

FIG. 8 illustrates in cross section each of the first sponge pads 25. As seen from this figure, each sponge pad 25 has a circular body or plate member 25a and a circular absorbent cleaning member in the form of a sponge member 25b. The circular body 25a has a bore 25c at the center thereof, through which a cleaning medium in the form of a detergent W supplied or ejected from a hose 25d is guided to the central portion of a surface of the circular sponge member 25a.

On the other hand, the sponge member 25b is adapted to be placed in contact with a surface of the disk D, and it is adhered to an adjacent surface of the circular body 25a.

Such sponge pads 25 are provided on the opposite sides of a related disk D, i.e., on the front and back sides of a drawing sheet of FIG. 7, in such a manner that the disk D is clamped by the pair of sponge pads 25.

More specifically, when the holder 24 grasping two disks D is rotated to the position of the cleaning device 21 or 22 or 23, the sponge pad 25 disposed on the back side of the drawing sheet of FIG. 7 is moved to the disk D side so as to be placed in contact with the rear surface of the disk D. In this state, that sponge pad 25 is caused to rotate by means of a motor provided on the backside of the index table 20. On the other hand, when the holder 24 is moved to the position of the cleaning device 21 or 22 or 23, a sponge pad 25 disposed on the front side of the drawing sheet of FIG. 7 is moved to the disk D side together with a support member 28 so as to be placed into contact with the front surface of the disk D, whereby it is caused to rotate together with the rotation of the backside sponge pad 25.

In this manner, one pair of first sponge pads 25 are driven to rotate while being in contact with the opposite surfaces of one disk D held by the chuck 24a, whereas another pair of first sponge pads 25 are caused to rotate while being in contact with the opposite surfaces of another disk D held by the chuck 24b.

On the other hand, the second and third sponge pads 26, 27 are moved in unison with related first backside sponge pad 25 when the holder 24 reaches the position of the cleaning device 21 or 22 or 23. With these movements, the second sponge pad 26 is inserted into the aperture DR in a related disk D and placed in contact with the inner peripheral edge of the disk D, while the third sponge pad 27 is placed in contact with the outer peripheral edge of the disk D. As a result, the second and third sponge pads 26, 27 are driven to rotate while being moved in their axial directions in association with the related first backside sponge pad 25.

After completion of the cleaning operation, the backside sponge pad 25 and the elongated sponge pads 26, 27 are retracted in the backward direction of the drawing sheet of FIG. 7, while the front side sponge pad 25 is moved in the forward direction of the drawing sheet of FIG. 7 in unison with the support member 28.

The cleaning devices 21, 22, 23 are each provided with a plurality of nozzles 24a, 24b for ejecting a detergent W toward the entire surface portions of a disk D, as schematically shown in FIG. 9.

In FIG. 9, the first nozzles 24a are disposed on the opposite sides of a corresponding disk D for ejecting the detergent W toward the opposite surfaces and the inner peripheral edge of the disk D, whereas the second nozzle 24b is disposed in the vicinity of the outer periphery of a corresponding disk D for ejecting the detergent W toward the outer peripheral edge of the disk D.

Among these nozzles, the second nozzle 24b and one of the first nozzles 24a disposed to the left of a disk D in FIG. 9 are movable in the right-and-left direction of FIG. 9 in unison with a sponge pad 25 disposed at the left side of FIG. 9. Also, the other first nozzle 24a disposed at the right side of a disk D is mounted on a related cover member 29.

The cover member 29 is normally positioned at a location at the right side of FIG. 9, i.e., at the front side of the drawing sheet of FIG. 4 or 7, so that when a holder 24 is rotated to the position of the cleaning device 21 or 22 or 23, the related cover member 29 is moved to the cleaning device side to thereby cover the entire cleaning device. In this state, the right-hand nozzle 24a is positioned as shown in FIG. 9.

Simultaneously with completion of the cleaning operation, the cover member 29 is moved away from the related cleaning device 21 or 22 or 23, allowing the related holder 24 to rotate.

Turning back to FIG. 1, the drying unit 3 serves to dry disks D conveyed there by the second handler 12 of the conveyor unit 1, and it comprises a second index table 30 and an ejector 31.

Figure 10:
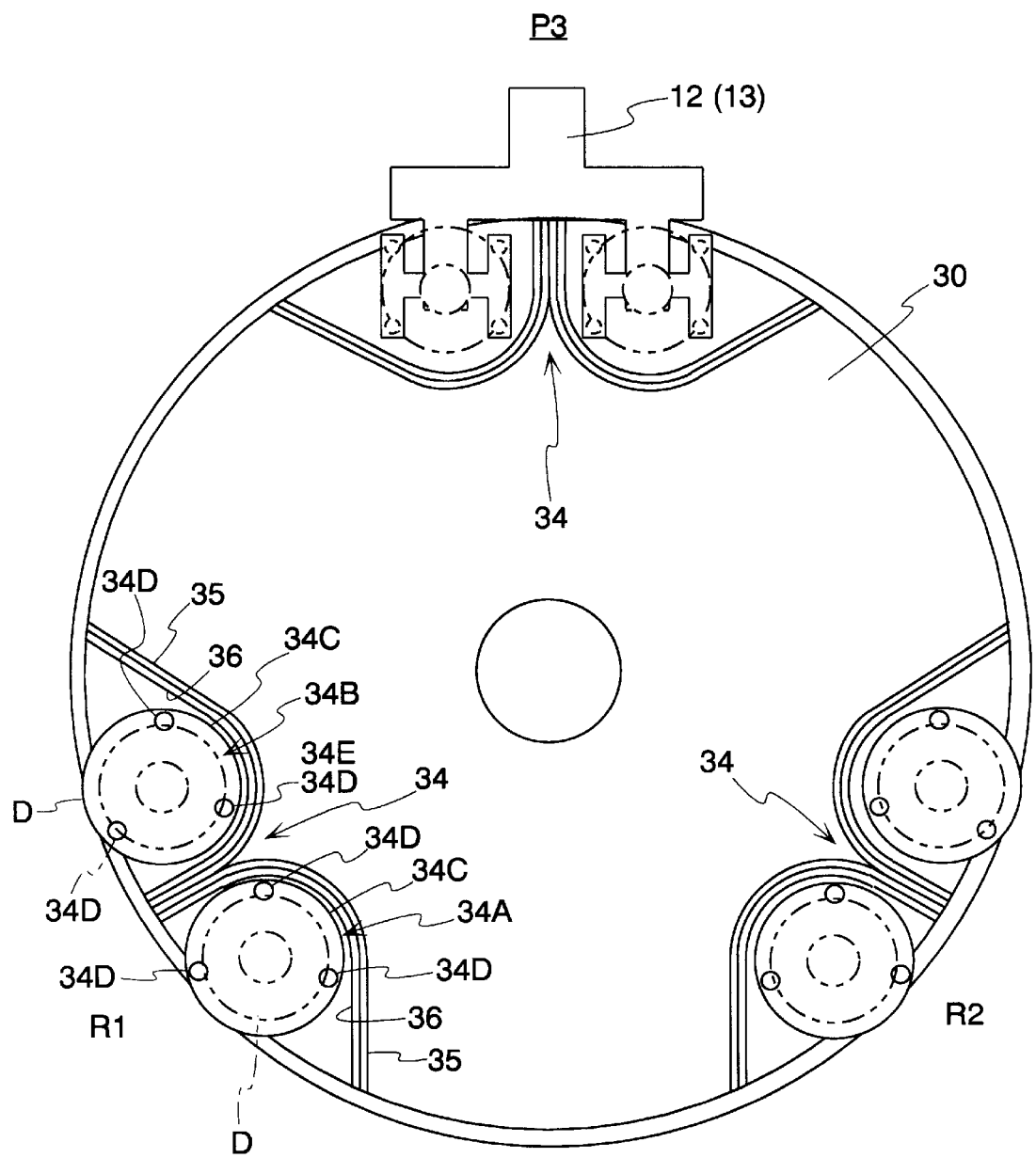
FIG. 10 is an enlarged front elevational view of a first index table of a drying unit.
Figure 11:
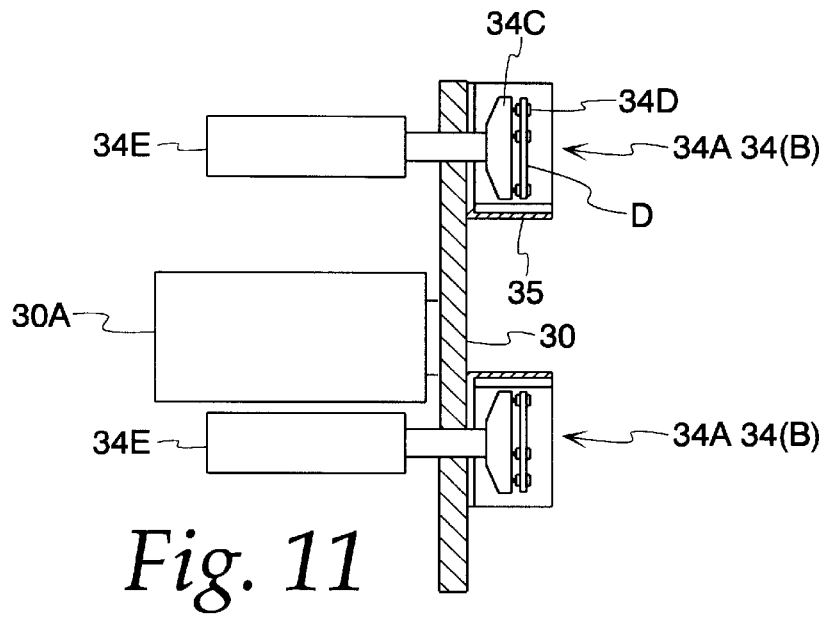
FIG. 11 is a partially cut-away side elevational view of the first index table of the drying unit.

FIG. 10 illustrates the second index table 30 in an enlarged scale as seen from the front side thereof, and FIG. 11 illustrates the detailed construction thereof as seen from one side thereof.

The second index table 30 comprises a circular rotary member, as shown in FIG. 10, which is driven to rotate in a discrete or stepwise manner at an angle of rotation of 120 degrees for each rotation by means of a geared motor 20a.

A plurality of (e.g., three in the illustrated embodiment) holders 34 are mounted on the index table 30 around the outer periphery thereof in a circumferentially spaced-apart relation with respect to each other, e.g., at an angle of 120 degrees apart from each other.

Each of the holders 34 comprises a pair of chucks 24a, 24b each of which in turn comprises a circular rotary member 24c, and three roller members 24d adapted to be movable in radial directions of a disk D so as to contact with and hold the outer peripheral edge of the disk D there between.

As clearly shown in FIG. 11, a plurality of motors 24e are mounted on the back side of the second index table 30 and each have a rotation shaft to which the rotary member 24c of a related chuck 24a or 24b is fixedly attached, so that the chuck 24a or 24b is driven to rotate at high speeds by means of a related motor 24e, thus causing liquid such as the detergent W and cleaning water attached to the disk D to spatter away.

In this case, however, the liquid spattered from the disk D during high-speed rotation of the chuck 24a or 24b may get the surroundings dirty.

In order to prevent this, a plurality of protection walls 35 are provided on the second index table 30 so as to surround the chucks 24a, 24b, respectively, from their central or inner side, as clearly shown in FIG. 10.

Specifically, to this end, each of the protection wall 35 has an absorbent member formed, for example, of sponge secured to the inner surface thereof for absorbing the liquid spattered from a related disk D to be dried.

Though not shown, liquid-receiving members such as trays are disposed at a rinsing position R1 and a drying position R2, respectively, in FIG. 10 for receiving the liquid spattered outwardly of the second index table 30.

In this manner, the second index table 30 equipped with the holders 34 and the protection walls 35 is driven to rotate under the control of the geared motor 20a at a predetermined angle of rotation (e.g., 120 degrees in the illustrated embodiment) upon each stepwise rotation in a direction indicated by an arrow B to transfer two disks D to the rinsing position R1 and the drying position R2, respectively, with the uppermost holder 34 being positioned at the third point P3.

Figure 12:
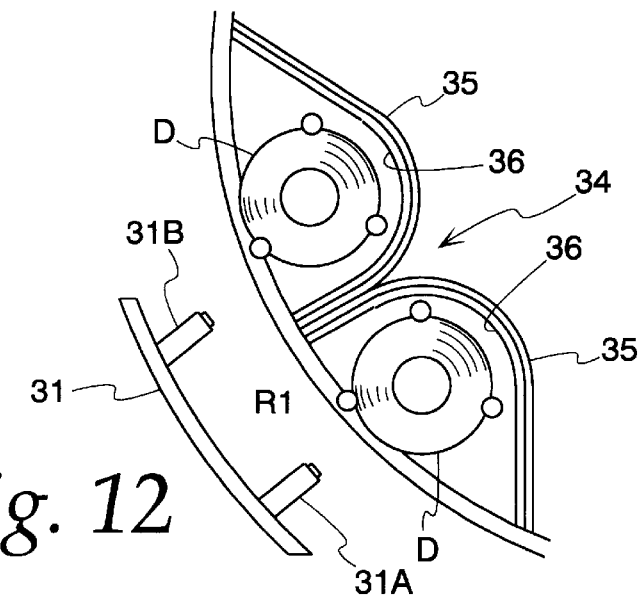
FIG. 12 is a front elevational view of an ejector.

The ejection device 31 is disposed at the rinsing position R1, as clearly shown in FIG. 12. The ejection device 31 comprises a pair of ejection nozzles 31 a, 31b for ejecting clean water such as pure water onto a pair of disks D held by a holder 34 to thereby rinse them.

On the other hand, at the fourth point P4 side as shown in FIG. 1, there is disposed a conveyor 60 which carries a pair of magazines 61, 62 located at the fourth point P4 for receiving a pair of disks D which have been conveyed there by the handler 13 of the conveyor unit 1.

Now, the operation of the disk cleaning and drying apparatus according to this embodiment will be described below in detail while referring to FIGS. 14(a) through (d).

Figure 14A:
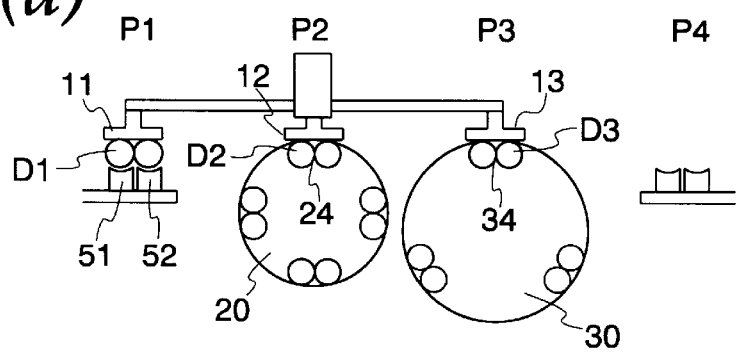
FIGS. 14($a$) through 14($c$) are schematic views showing different operating states of the disk cleaning and drying apparatus according to the present invention, wherein FIG. 14($a$) shows that disks are held by a plurality of handlers.
Figure 14B:
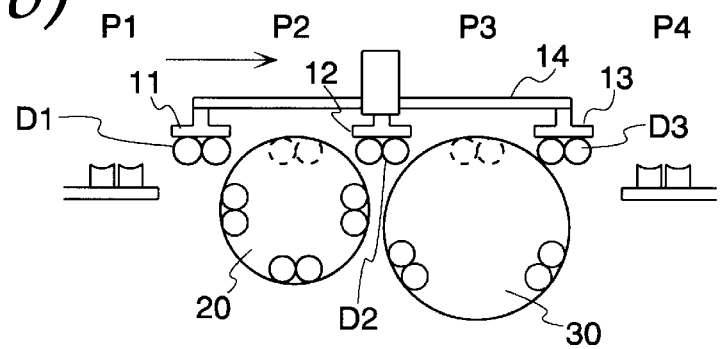
Figure 14C:
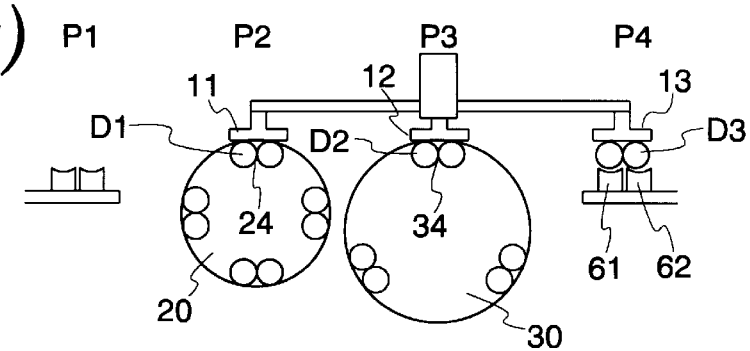
Figure 14D:
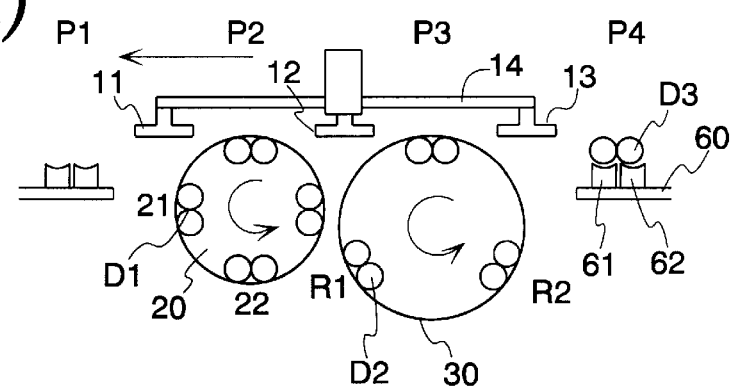
Figure 15:
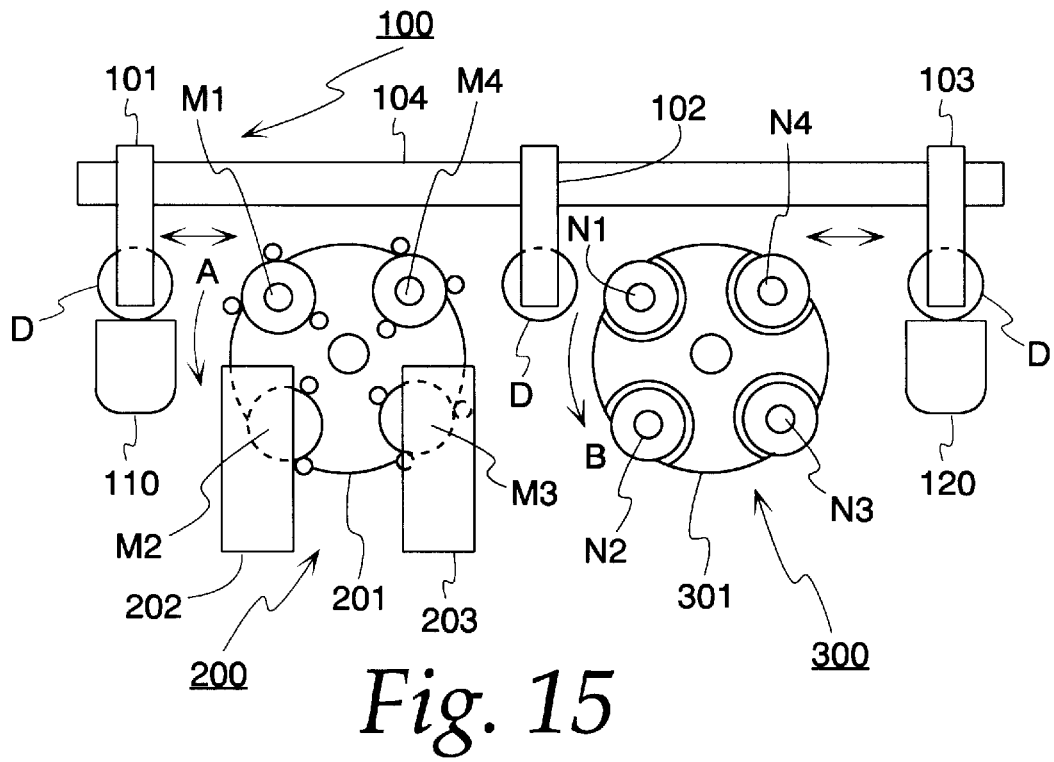
FIG. 15 is a schematic view showing the construction of a conventional cleaning and drying apparatus.
Figure 16:
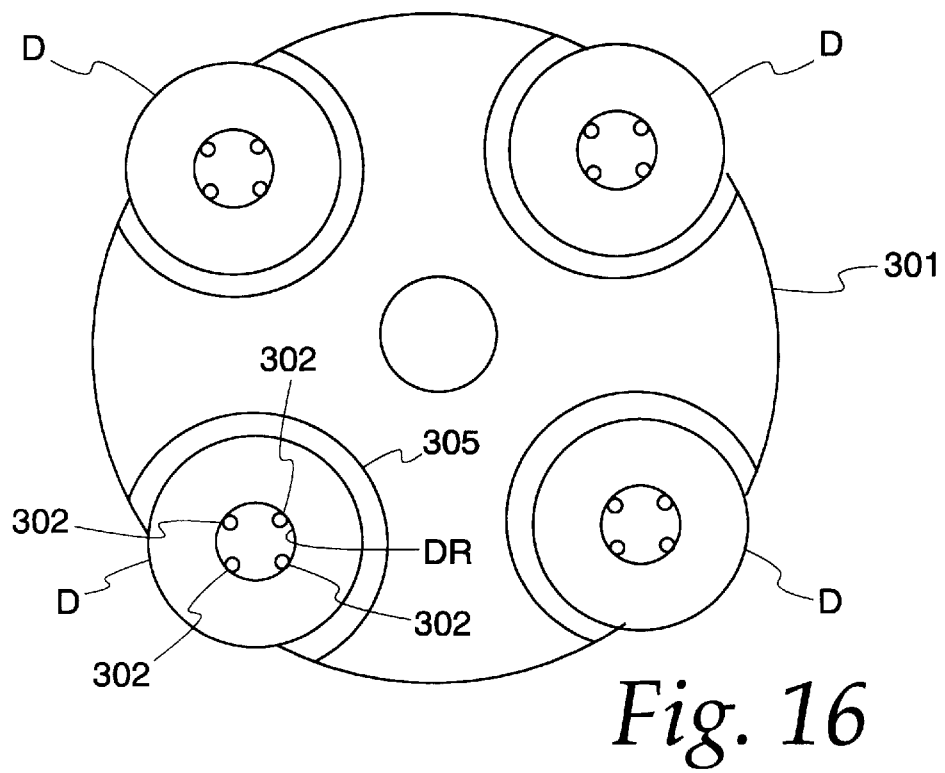
FIG. 16 is a front elevational view of an index table of a drying unit of the conventional cleaning and drying apparatus of FIG. 15.

FIGS. 14(a) through 14(d) show sequential operation steps of this embodiment, wherein FIG. 14(a) shows a state in which disks D are being held by the first though third handlers 11 through 13 of the conveyor unit 1; FIG. 14(b) shows a state in which the disks D are being conveyed by the handlers 11 through 13; FIG. 14(c) shows a state in which the disks D are being delivered from the handlers 11 through 13 and received by holders 24, 34 and the magazines 61, 62; and FIG. 14(d) shows a state in which the handlers 11 through 13 are being returned to their initial or original positions.

As shown in FIG. 14(a), when the first through third handlers 11 through 13 are positioned at the first, the second and the third points P1, P2, P3, respectively, a pair of disks D (hereinafter referred to simply as a disk pair D1) received in the magazines 51, 52, respectively, are held by the first handler 11. Simultaneous with this, another pair of disks D (hereinafter referred to simply as a disk pair D2) located at the uppermost position of the first index table 20 of the cleaning unit 2, and a further pair of disks D (hereinafter referred to simply as a disk pair D3) located at the uppermost position of the second index table 30 of the drying unit 3 are released from the second and third holders 24, 34 and held by the handlers 12, 13, respectively.

When the rail 12 in this state are then driven to move to the right in FIG. 14(b) by means of the drive element 10 (see FIG. 1), the disk pairs D1 through D3 held by the handlers 11 through 13 are conveyed to the second through fourth points P2 through P4, respectively. Thus, the uppermost holders 24, 34 of the first and second index tables 20, 30 become vacant or unoccupied.

Subsequently, when the disk pairs D1 through D3 have been conveyed to the second through fourth points P2 through P4, respectively, as shown in FIG. 14(c), they are all released from the handlers 11 through 13, and the disk pairs D1, D2 are held by the uppermost holders 24,34 of the index tables 20, 30, respectively, and the disk pair D3 are received by the magazine 61, 62, respectively.

Thereafter, as shown in FIG. 14(d), the rail 4 is driven to move to the left in this figure, so that the vacant or unoccupied handlers 11 through 13 return to the first through third points P1 through P3, respectively.

Simultaneous with this, the first index table 20 is rotated at an angle of 90 degrees and the second index table 30 is rotated over an angle of 120 degrees, whereby the disk pair D1 are moved to the position of the first cleaning device 21 of the cleaning unit 2 and the disk pair D2 are moved to the rinsing position R1 of the drying unit 3.

Further, in the case where the magazines 61, 62 are full of the disk pair D3, the magazines 61, 62 are conveyed to prescribed positions by virtue of the conveyor 60.

When the disk pair D1 reaches the cleaning device 21 (or 22 or 23), the first sponge pads 25 and the second and third elongated sponge pads 26, 27 as shown in FIG. 7 are moved to the disk pair D1 side, and the cover member 29 is moved to the first index table 20 side to cover the entire cleaning device 21 (or 22 or 23) as well as the disk pair D1. In this manner, the nozzles 24a, 24b are disposed in such a manner as shown in FIG. 9, whereby the detergent W is directed from the nozzles 24a to the opposite surfaces and the inner peripheral edge of each disk D, and from the nozzle 24b to the outer peripheral edge of each disk D.

The sponge pads 25 clamping the disk pair D1 from the opposite sides thereof held by the holder 24 are driven to rotate, and the sponge pad 27 being in contact with the inner peripheral edge of each disk D is also driven to rotate and move in its axial direction. The sponge pad 27 is also rotated and moved in its axial direction while being in contact with the outer peripheral edge of each disk D.

In this manner, each disk D is caused to rotate together with the rotation of the sponge pad 25 and the sponge pads 26,27 so as to be cleaned by the rotating sponge pads 25 through 27 and the detergent W.

At this time, the detergent W supplied to the first sponge pad 25 reaches the sponge member 25b thereof contacting the disk D by way of the aperture 25c in the circular plate 25a shown in FIG. 8, so that it is absorbed into the sponge member 25b. Since the sponge member 25b is of a porous material, the detergent W thus absorbed spreads over the entire body of the sponge member 25b from its central portion. As a consequence, the detergent W is uniformly distributed between the sponge member 25b and the surface of the disk D, thus realizing substantially complete cleaning of the disk D.

Furthermore, since the second and third sponge pads 26, 27 are each caused to rotate while being to driven to move in their axial directions, there will not be such a possibility that some portions of the sponge pads 26, 27 are subjected to heavy localized wear. This not only serves to improve the cleaning efficiency of the cleaning pads 26, 27, but also prolong the length of life thereof.

Moreover, the detergent W spattered during the cleaning operation is shielded by means of the cover members 29, thereby preventing the surroundings from being got muddy or smeared.

Upon completion of the cleaning of the disk pair D1 by means of the first cleaning device 21, the first sponge pad 25, the second and third elongated sponge pads 26, 27, the cover member 29 and the nozzles 24a, 24b are all moved away from the disk pair D1. Thereafter, when the first index table 20 is driven to rotate at an angle of 90 degrees at such timing as shown in FIG. 14(d), the disk pair D1 reach the second cleaning device 22, where they are subjected to a second cleaning operation by the second cleaning device 22 in the same manner as described above. Subsequently when the first index table 20 is further rotated at an angle of 90 degrees, the disk pair D1 reach the third cleaning device 23, where they are similarly cleaned by the third cleaning device 23 just as described above.

Upon a further 90-degrees rotation of the index table 20, the disk pair D1 having been cleaned arrives at the uppermost position of the first index table 20, where they are held by the second handler 12 and conveyed to a holder 34 at the uppermost position of the second index table 30.

When the disk pair D1 are held by the holder 34, the second index table 30 is driven to rotate at an angle of 120 degrees by the geared motor 20a, thereby transferring the disk pair D1 to the rinsing position R1, as in the case of the disk pair D2 of FIG. 14(d), whereupon the ejection device 31 begins to eject pure water onto the disk pair D1 through the ejection nozzles 31a, 31b for rinsing them. During the rinsing operation, pure water attached to the surfaces of the disk pair D1 are forced to spatter due to the high-speed rotation of the holder 34 holding the disk pair D1. That is, at the rinsing position R1, the disk pair D1 are subjected to the rinsing operation, during which, however, the pure water spattered from the disk pair D1 due to their high-speed rotation is absorbed by the sponge member 36 on the inner surface of the related protection wall 35.

When the rinsing operation of the disk pair D1 by means of the ejection device 31 has been finished, the second index table 30 is driven to rotate over an angle of 120 degrees at such timing as shown in FIG. 14(d).

Although during the rotation of the second index table 30, the protection wall 35 surrounding the disk pair D1 is turned upside down, the pure water spattered from the disk pair D1 toward the protection wall 35 is absorbed by the sponge member 36, thus avoiding the possibility of the rinsing pure water being again attached to the disk pair D1 to smear them.

When the disk pair D1 are moved to the drying position R2 due to the rotation of the second index table 30, the pure water remaining on the surfaces of the disk pair D1 is forced to spatter under the influence of a centrifugal force generated upon the high-speed rotation of the holder 34. In this manner, the disk pair D1 is completely dried.

Specifically, since the holder 34 holds the outer peripheral edge of each disk D instead of the inner peripheral edge thereof, even the pure water attached to the inner peripheral edge of each disk D is forcibly spattered upon high-speed rotation of each disk D, thus completely drying the disk pair D1.

After the drying operation, when the second index table 30 is rotated at an angle of 120 degrees, the disk pair D1 having been dried reach the uppermost position of the second index table 30, where they are held by the third handler 13 and conveyed to the magazines 61, 62, as in the case of the disk pair D3 of FIGS. 14(a) through 14(c).

The above-mentioned transferring, cleaning and drying operations carried out with respect to the disk pair D1 are all repeatedly performed on all the remaining disk pairs in a continuous manner.

As a result, according to the disk cleaning and drying apparatus of this embodiment, the number of disks to be treated per unit time becomes at least doubled as compared with the aforesaid conventional disk cleaning and drying apparatus.

Since each disk D is subjected to triple cleaning operations by means of the three cleaning devices 21 through 23, it is possible to ensure a sufficient cleaning time for each disk. In addition, the second index table 30 is driven to rotate in synchronization with the first index table 20, so that a long drying time can be taken at the drying position R2, thereby ensuring a sufficient period of time for drying. In particular, since disks after having been subjected to a polishing operation requires complete or satisfactory cleaning and drying, using the above-mentioned apparatus according to the present invention for the purpose of cleaning and drying such disks can provide extremely great benefits.

Furthermore, due to the construction that delivery and take-out of a disk pair at the first or second index table 20, 30 are carried out by use of a single holder 24 or 34, the holder 24 or 34 is only one which has no contribution to the cleaning and drying operations. That is, cleaning and drying operations can be done for all the disks that are held by the remaining holders, as a consequence of which a great number of disks can be cleaned and dried in a short period of time without increasing the diameter of each of the index tables 20, 30.

Here, it is to be noted that the present invention is not limited to the above-described embodiment, but instead many changes and/or modifications thereof can be made within the scope and spirits of the present invention as defined in the appended claims.

For example, although in the above embodiment, the number of disks D to be conveyed and held by the handlers 11 through 13 and the holders 24, 34 at a time is described as two, this should not be construed as limiting the invention, but the number of disks to be handled by these handlers and holders may be three or more depending upon the sizes or dimensions of the respective disks D and the index tables 20, 30.

Figures 13A, 13B:
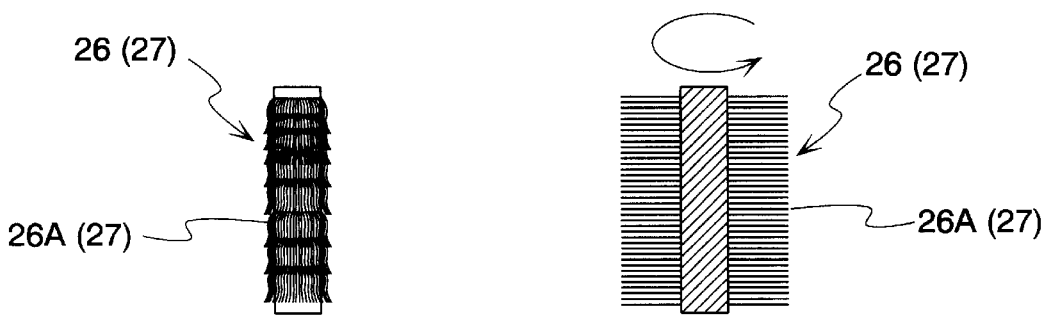
FIG. 13($a$) is a plan view of a modified form of a second (or third) cleaning element according to the invention.

Moreover, although in the above embodiment, the elongated sponge pads 26, 27 are employed for the second and third cleaning elements, they can be constructed such that they have brush fairs which are lying in the normal state, as shown in FIG. 13(a), but they are caused to rise up upon rotation thereof so as to perform the function of cleaning elements, as clearly shown in FIG. 13(b). With such a construction, it is possible to effectively prevent clogging or degradation of the cleaning elements.

Additionally, though the cleaning devices 21 through 23 are constructed such that they act to clean disks D while supplying the detergent W onto the disks D, they can instead be constructed such that they use other liquids such as ordinary water, pure water or the like in place of such a detergent.

Furthermore, in the above embodiment, the drying unit 3 is constructed such that each of the holders 34 has three rollers 24d for holding the outer peripheral edge of a disk D, but this construction can of course be modified such that the rollers 24d are expanded outwardly or moved in radially outer directions of a disk D to engage the inner peripheral edge thereof around the aperture DR therein to hold the disk D from the inside thereof.

Still more, although in the above embodiment, drying of a disk D at the drying position R2 is carried out by high-speed rotation of the disk, one or more fluid ejectors can be provided for ejecting a fluid such as air, heated air, a variety of gases, a liquified nitrogen, etc., to the disk D rotating at high speed, thus improving the drying efficiency.

Further, in the above embodiment, the protection wall 35 is equipped at its inner surface with the absorbent member in the form of the sponge member 36, but the sponge member can be replaced with other absorbents such as a polishing pad or the like.

What is claimed is:

1. A disk cleaning and drying apparatus comprising:

a cleaning unit having a first index table with a plurality of first holders for holding disks to be cleaned, cleaning means provided on said first index table for cleaning said disks, and first drive means for driving said first index table to rotate at a first predetermined angle of rotation to thereby move disks held by said plurality of first holders to said cleaning means;

a drying unit having a second index table with a plurality of second holders for holding disks to be dried, drying means provided on said second index table for drying said disks, and second drive means for driving said second index table to rotate at a second predetermined angle of rotation; and conveyor means adapted to reciprocate from a first point to a second point, and from the second point to a third point, and from the third point to a fourth point, in a unitary manner for conveying disks to be cleaned from said first point to said second point at which the disks thus conveyed are delivered to and held by one of said first holders of said first index table just positioned at said second point, said conveyor means being operable to take disks which have been cleaned by said cleaning unit out of one of said first holders positioned at said second point and convey them to said third point at which the disks thus conveyed are delivered to and held by one of said second holders of said second index table just positioned at said third point, said conveyor means being further operable to take disks which have been dried by said drying unit out of one of said second holders of said second index table positioned at said third point and convey them to said fourth point.

2. The disk cleaning and drying apparatus according to claim 1, wherein said conveyor means can convey a plurality of disks at one time, and wherein each of said first and second holders of said first and second index tables can hold the plurality of disks conveyed by said conveyor means at one time.

3. The disk cleaning and drying apparatus according to claim 1, wherein said cleaning means comprises:

a first cleaning element being rotatable while contacting surfaces of a plurality of disks to be cleaned;

a second cleaning element being rotatable while contacting an inner peripheral edge of each of said plurality of disks to be cleaned, said second cleaning element being movable toward and away from each disk in an axial direction thereof; and a third cleaning element being rotatable while contacting an outer peripheral edge of each of said plurality of disks to be cleaned, said third cleaning element being movable toward and away from each disk in an axial direction thereof.

4. The disk cleaning and drying apparatus according to claim 3, wherein said first cleaning element comprises:

a plate member having a bore formed at its central portion for supply of a cleaning medium; and an absorbent cleaning member secured to said plate member for contacting and cleaning a surface of each disk to be cleaned, said absorbent cleaning member being supplied with said cleaning medium through said bore in said plate member.

5. The disk cleaning and drying apparatus according to claim 4, wherein said absorbent cleaning member is formed of sponge.

6. The disk cleaning and drying apparatus according to claim 4, wherein each of said second holders of said drying unit rotates a corresponding one of said disks while holding an outer peripheral edge thereof.

7. The disk cleaning and drying apparatus according to claim 6, wherein said drying unit further comprises fluid ejecting means for ejecting fluid to said rotating disks to be dried.

8. The disk cleaning and drying apparatus according to claim 1, wherein said drying unit further comprises protection wall means provided on said second index table so as to surround each of said second holders for absorbing liquid spattered from said rotating disks to be dried.

* * * * *